United States Patent [19]

Schwenk et al.

[11] Patent Number: 4,586,075
[45] Date of Patent: Apr. 29, 1986

[54] SEMICONDUCTOR RECTIFIER

[75] Inventors: Siegfried Schwenk; Andreas Hössler; Klaus Heyke, all of Reutlingen; Alexander Wallrauch, Gomaringen, all of Fed. Rep. of Germany

[73] Assignee: Robert Bosch GmbH, Stuttgart, Fed. Rep. of Germany

[21] Appl. No.: 716,472
[22] PCT Filed: Jun. 16, 1982
[86] PCT No.: PCT/DE82/00128
§ 371 Date: Feb. 22, 1983
§ 102(e) Date: Feb. 22, 1983
[87] PCT Pub. No.: WO83/00074
PCT Pub. Date: Jan. 6, 1983

Related U.S. Application Data

[63] Continuation of Ser. No. 474,586, Feb. 22, 1983.

[30] Foreign Application Priority Data

Jun. 24, 1981 [DE] Fed. Rep. of Germany .... 3124692.3

[51] Int. Cl.$^4$ ............... H01L 23/28; H01L 23/02; H01L 23/36
[52] U.S. Cl. ........................ 357/74; 357/72; 357/79; 357/81
[58] Field of Search ............. 357/81, 72, 79, 74

[56] References Cited

U.S. PATENT DOCUMENTS

| | | | |
|---|---|---|---|
| 3,081,374 | 3/1963 | Burch | 357/72 |
| 3,267,341 | 8/1966 | Evander | 357/81 |
| 3,412,788 | 11/1968 | Pomerantz | 357/81 |
| 3,419,762 | 12/1968 | Lucas | 357/72 |
| 3,743,896 | 7/1973 | Weiske | 357/72 |
| 3,896,480 | 7/1975 | Harnden | 357/74 |
| 3,988,825 | 11/1976 | Fuchs et al. | 357/74 |
| 4,007,477 | 2/1977 | Goodman | 357/74 |
| 4,330,790 | 5/1982 | Burno | 357/72 |

FOREIGN PATENT DOCUMENTS

| | | | |
|---|---|---|---|
| 2501337 | 7/1975 | Fed. Rep. of Germany | 357/74 |
| 2912189 | 10/1979 | Fed. Rep. of Germany | 357/81 C |

Primary Examiner—Martin H. Edlow
Assistant Examiner—Jerome Jackson, Jr.
Attorney, Agent, or Firm—Frishauf, Holtz, Goodman & Woodward

[57] ABSTRACT

A semiconductor rectifier which is embodied substantially in a rotationally symmetrical manner is proposed. The semiconductor rectifier includes a semiconductor chip (10) and two connector leads (11, 12), each of which is soldered to one of the two main surfaces of the semiconductor chip (10). The first lead (11) forms a bolt-like, solid metal base, which comprises a first part (11a) soldered to the semiconductor chip (10) and a second part (11b) provided with knurling. The second lead (12) is embodied as a head wire and the head portion (12a) of this head wire is soldered to the semiconductor chip (10). A synthetic resin mass (13) is furthermore provided, which covers the rim of the semiconductor chip (10), the first part (11a) of the first lead (11) and portions of the second lead (12). The second part (11b) of the first lead (11) is pressed into a cooling plate (14) serving to cool the rectifier. In the vicinity of this second part (11b), the cooling plate forms a passage (14), which extends over the entire second part (11b), the free end (14b) of the passage (14a) covering that portion of the second part (11b) which adjoins the first part (11a). For limiting the synthetic resin (13) in the radial direction, a sheath (15) embodied in the form of a cylindrical jacket is provided, which is lapped over the passage (14a) by means of seaming. The synthetic resin mass (13) and the sheath (15) extend outward in the axial direction beyond the head portion (12a) of the second connector lead (12). (FIG. 1.)

9 Claims, 3 Drawing Figures 4,586,075

SEMICONDUCTOR RECTIFIER

This application is a continuation of application Ser. No. 474,586, filed Feb. 22, 1983.

The invention relates to a semiconductor rectifier, and more particularly to a button-type rectifier with a cooling plate.

BACKGROUND

German Pat. No. 15 89 555 describes a semiconductor rectifier in which a semiconductor terminal has two parts. The second part of the terminal has a substantially larger diameter than does the first part. A mass of synthetic resin forms an outermost jacket and takes the form of a truncated cone. The synthetic resin jacket must be fabricated by transfer molding.

THE INVENTION

It is an object to provide a semiconductor rectifier which can be readily made, is totally encapsulated, and can be easily fitted into a cooling plate, while being protected in all aspects from environmental influences or damage.

Briefly, a cooling plate has an opening stamped therein which has a rim or ridge which is drawn out in a direction transverse to the major direction of the cooling plate to form a projecting rim or beam or collar. The rim or bead or collar may be short, and form a seating surface for a surrounding jacket. The semiconductor, secured to a terminal in form of a post or bolt, is press-fitted into the opening, and the space between the surrounding jacket and the semiconductor, including the upper edge of the collar or bead or rim, is filled with a resin compound, totally encapsulating the semiconductor, and a portion of a second terminal emanating centrally from the semiconductor. The collar may, however, also be drawn up parallel to the semiconductor, and the post sufficiently enlarged in the press-fitted area to form a clearance space between the semiconductor chip and the post which, then, can be filled with the resin compound, so that, again, the space between the semiconductor and the surrounding jacket, now formed by the rim or bead, is completely filled. The rim or bead can be extended in either direction, for example partly upwardly, partly downwardly—with respect to the axial extent of the semiconductor, and in relation to the plane of the cooling plate, so that the semiconductor is seated either essentially coplanar with the major extent of the cooling plate or, for example, within an end portion of the cooling rim or plate, not necessarily coincident with its major extent.

The semiconductor rectifier according to the invention has the advantage over the prior art that the synthetic resin mass can be poured by filling the space within a sheath or a cylindrical jacket, or the portion of the passage protruding beyond the bolt or socket-like second part of the first terminal, or by filling a conically opened portion of the cooling plate, respectively, to form an easily made and wholly encapsulated rectifier-cooling plate combination.

DRAWING

Three exemplary embodiments of the semiconductor rectifier according to the invention are shown in the drawing and explained in detail in the following description. Shown are:

FIG. 1, an axial section taken through the first exemplary embodiment;

FIG. 2, an axial section taken through the second exemplary embodiment; and

FIG. 3, an axial section taken through the third exemplary embodiment.

DESCRIPTION OF THE EXEMPLARY EMBODIMENTS

Figure 1:
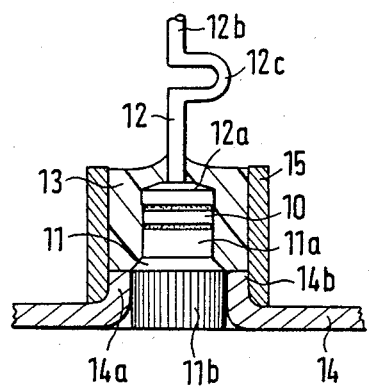

FIG. 1 shows a semiconductor rectifier formed, substantially, in a rotationally symmetrical manner, having a semiconductor chip 10 and two connector terminals 11 and 12, which are each soldered to a respective one of the two main surfaces of the semiconductor chip 10. The first terminal 11 thereby forms a bolt-like, solid metal base, which comprises a first part 11a soldered to the semiconductor chip 10 and a second part 11b which is provided with knurling. The second terminal 12 is a headed wire. The head part 12a of this headed wire is soldered to the semiconductor chip 10. A synthetic resin mass 13 is furthermore provided, which covers the rim of the semiconductor chip 10, the first part 11a of the first terminal 11 and portions of the second terminal 12. The second part 11b of the first connector terminal 11 which is provided with knurling is pressed into a cooling plate 14 serving to cool the rectifier; in the vicinity of this second part 11b, the cooling plate forms, an upwardly extending bead, or rim, or collar 14a with a passage therethrough which extends over the entire second part 11b. The free end 14b of the bead or collar 14a covers that portion of the second part 11b which adjoins the first part 11a. For limiting flow of the synthetic resin mass 13 in the radial direction, a sheath 15 in the form of a cylindrical jacket is provided, which is fitted over the outer circumference of the bead 14a. The synthetic resin mass 13 extends outward in the axial direction over the head part 12a of the second terminal 12. The wire-like part 12b of the second terminal 12 is provided with a strain relief 12c.

Figure 2:
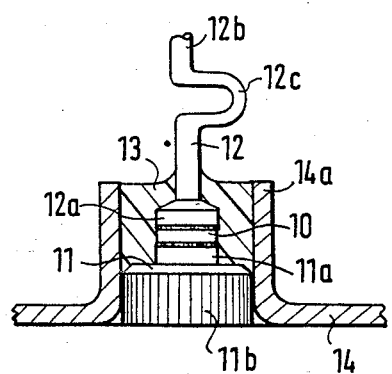

Embodiment of FIG. 2:

Again, it is a semiconductor rectifier embodied in a substantially rotationally symmetrical manner, having a semiconductor chip 10 and two connector terminals 11 and 12, each being soldered to a respective one of the two main surfaces of the seamiconductor chip 10 and the first of which forms a bolt-like, solid metal base 11. The first terminals 11 again comprises a first part 11a which is soldered to the semiconductor chip 10 and a second part 11b which is provided with knurling. The second part 11b, however, in comparison with the exemplary embodiment of FIG. 1, has a substantially larger diameter than does the first part 11a. The second connector terminals 12 is again embodied as a head wire. The headed portion 12a of this headed wire is soldered to the semiconductor chip 10. A synthetic resin mass 13 is also provided once again, covering the rim of the semiconductor chip 10, the first part 11a of the first terminals 11 and portions of the second terminal 12. The second part 11b provided with knurling is again pressed into an opening in cooling plate 14. However, the bead 14a protrudes in form of an upwardly extending sleeve-like rim or collar the second part 11b in the direction toward the first part 11a, and simultaneously serves to define the radial extent of synthetic resin mass 13 in the radial direction. The synthetic resin mass 13 and the rim 14a here extend outward in the axial direction beyond the head part 12a of the second terminal 12.

The wire-like part 12b of the second terminal 12 is provided with a strain relief 12c.

Figure 3:
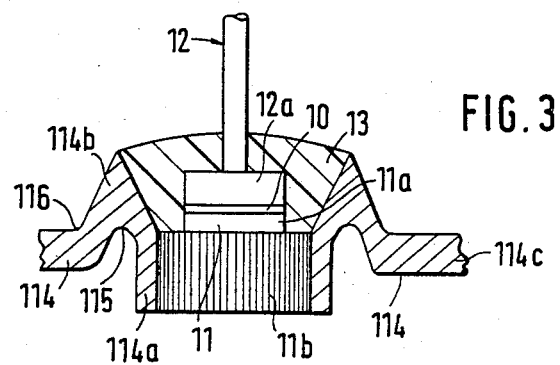

Embodiment of FIG. 3:

The rotationally symmetrical semiconductor rectifier shown in FIG. 3 includes a semiconductor chip 10 and two terminals 11 and 12, which are each soldered to one of the two main surfaces of the semiconductor chip 10. The first connecting terminal 11 forms a bolt-like, solid metal base, which comprises a first part 11a welded to the semiconductor chip 10 and a second part 11b provided with knurling. The second part 11b has a larger diameter than does the first part 11a. A synthetic resin mass 13 is provided, which covers the rim of the semiconductor chip 10, the first part 11a of the first terminal 11 and portions of the second terminal 12. In accordance with the invention, the second part 11b is pressed into a cooling plate 114 serving to cool the rectifier. The cooling plate 114 is shaped to form a cylindrical jacket or collar 114a in the vicinity of the second part 11b, then makes a transition to a conically opened portion 114b which serves as a boundary for the synthetic resin mass 13; finally, after making a first bend 115 and a second bend 116, the cooling plate makes a transition to a flat zone 114c. The second connector terminal 12 is a headed wire and the head portion 12a of this head wire is soldered to the semiconductor chip 10. The synthetic resin mass 13 extends outward in the axial direction beyond the head part 12a of the terminal 12.

In all three exemplary embodiments, a surface-protecting layer comprising a cover paint can be applied to the rim of the semiconductor chip 10 and to the surface areas of the two connector terminals 11, 12 which adjoin the semiconductor chip 10; this surface-protecting layer is then covered by the synthetic resin mass 13.

We claim:

1. A semiconductor rectifier comprising
   a rotation-symmetrical semiconductor chip (10) of essentially plate form having a first major surface and a second major surface;
   a first rotation-symmetrical terminal (11) having a first portion (11a) soldered to the first major surface of the chip, and a second portion (11b) defining a rotation-symmetrical bolt-like solid metal element;
   a second terminal (12) secured to the second major surface of the chip;
   a cooling plate (14) formed with a circular opening therein, in which said solid metal element of said second portion (11b) of the first terminal (11) is seated;
   the region of the cooling plate (14) surrounding said opening being formed with an integral bead or rim or collar ((14a) projecting from a major plane of the cooling plate, and leaving an opening of at least the inner diameter of said bead or rim or collar;
   a cylindrical confining wall or jacket (15) surrounding, with clearance space, said semiconductor chip (10), said first portion (11a) of the first terminal and at least part (12a) of the second terminal;
   a poured synethetic resin mass (13) filling the clearance space between the semiconductor chip (10), the first portion (11a) of the first terminal (11) and the at least part (12a) of the second terminal, and an inner surface of said confining wall or jacket;
   wherein the second portion (11b) of the first terminal (11) is formed with a knurled surface and pressed into said opening, and into said bead or rim or collar to be gripped thereby,
   said bead or rim or collar extending essentially over the axial extent of said solid metal element forming the second portion (11b) of the first terminal, and terminating approximately at a level of the junction of the first and second portions (11a, 11b) of the first terminal;
   and wherein the cylindrical confining wall or jacket comprises a separate cylindrical element (15) fitted about the outer circumference of said bead or rim or collar (14) formed in the cooling plate.

2. Rectifier according to claim 1, wherein said second terminal comprises a headed wire having a head portion (12a) soldered to the second major surface of the chip, said head portion being entirely embedded within said synthetic resin mass.

3. Rectifier according to claim 1, wherein the semiconductor chip defines a rim;
   and wherein a surface protecting layer is provided, extending over the first portion (11a) of the first terminal, said semiconductor chip (10), at least part of said second terminal, and over the rim, said surface protecting layer being covered by said resin mass.

4. Rectifier according to claim 1, wherein said second terminal comprises a headed wire having a head portion (12a) soldered to the second major surface of the chip, said head portion being entirely embedded within said sythetic resin mass.

5. Rectifier according to claim 1, further comprising a surface protecting layer over the first portion (11a) of the first terminal, said semiconductor chip (10) and at least part of said second terminal, said surface protecting layer being covered by said resin mass, and extending over the rim of the semiconductor chip (10).

6. A semiconductor rectifier comprising
   a rotation-symmetrical semiconductor chip (10) of essentially plate form having a first major surface and a second major surface;
   a first rotation-symmetrical terminal (11) having a first portion (11a) soldered to the first major surface of the chip, and a second portion (11b) defining a rotation-symmetrical bolt-like solid metal element;
   a second terminal (12) secured to the second major surface of the chip;
   a cooling plate (14) formed with a circular opening therein, in which said solid metal element of said second portion (11b) of the first terminal (11) is seated;
   the region of the cooling plate (14) surrounding said opening being formed with an integral bead or rim or collar (14a) projecting from a major plane of the cooling plate, and leaving an opening of at least the inner diameter of said bead or rim or collar;
   a confining wall surrounding, with clearance space, said semiconductor chip (10), said first portion (11a) of the first terminal and at least port (12a) of the second terminal;
   a poured synthetic resin mass (13) filling the clearance space between the semiconductor chip (10), the first portion (11a) of the first terminal (11) and the at least part (12a) of the second terminal, and an inner surface of said confining wall;
   wherein the second portion (11b) of the first terminal (11) is formed with a knurled surface and pressed into said opening, and into said bead or rim or collar to be gripped thereby, wherein said solid metal element of the second portion (11b) of said first terminal (11) has a diameter larger than said first portion (11a);

the bead or rim or collar (114a) of the cooling plate extends in one direction with respect to the surface of the cooling plate (114);

said cooling plate is formed to define an upstanding portion (114b) having generally conical shape extending in the opposite direction from the major plane of the cooling plate, with respect to said bead or rim or collar, confining the poured synthetic resin and forming the confining wall;

and said cooling plate is deformed to form a flat zone (114c), a first bend (115) extending from one side of the cooling plate, from which said bead or rim or collar (114a) extends, and a second bend (116) from which said upstanding portion extends, located at the opposite side of said cooling plate with respect to said first bend.

7. Rectifier according to claim 6, wherein said second terminal comprises a headed wire having a head portion (12a) soldered to the second major surface of the chip, said head portion being entirely embedded within said synthetic resin mass.

8. Rectifier according to claim 6, wherein the semiconductor chip defines a rim;

and wherein a surface protecting layer is provided, extending over the first portion (11a) of the first terminal, said semiconductor chip (10), at least part of said second terminal, and over the rim, said surface protecting layer being covered by said resin mass.

9. Rectifier according to claim 6, wherein said bead or rim or collar (114a), said upstanding portion (114b) and said cooling plate comprise a single unitary shaped structure.

* * * * *